June 25, 1963 C. G. THORNTON 3,095,526

SEMICONDUCTOR UNIT

Filed Feb. 20, 1961 2 Sheets-Sheet 1

INVENTOR.

CLARENCE G. THORNTON

BY F. D. Prager

ATTORNEY

INVENTOR.
CLARENCE G. THORNTON
BY
F. D. [signature]
ATTORNEY

United States Patent Office 3,095,526
Patented June 25, 1963

3,095,526

SEMICONDUCTOR UNIT

Clarence G. Thornton, Philadelphia, Pa., assignor, by mesne assignments, to Philco Corporation, Philadelphia, Pa., a corporation of Delaware Filed Feb. 20, 1961, Ser. No. 119,755
3 Claims. (Cl. 317—235)

Figure 1:
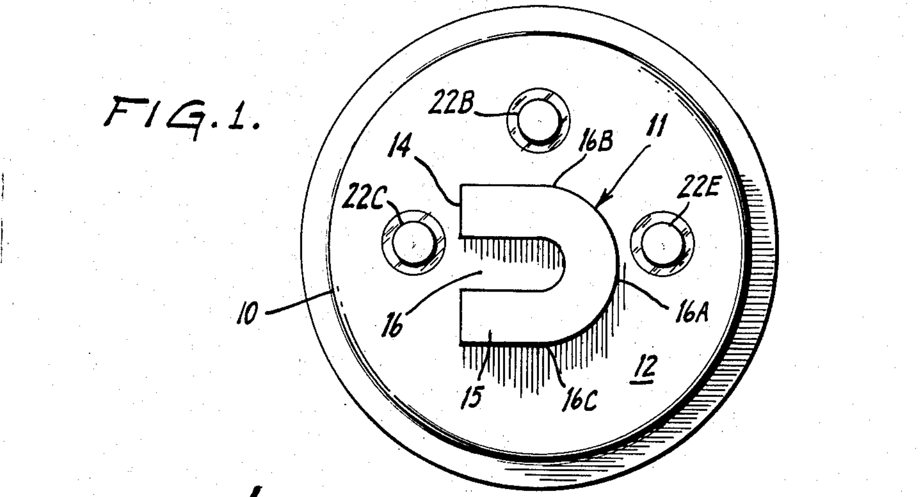

This invention relates to semiconductor devices such as transistors. It provides an improved mounting and heat sink structure for a device of this kind.

It has been an object of endeavor and invention in this field to mount transistors and particularly high-frequency transistors so as to insure effective dissipation of heat which is generated therein by the normal use of the devices. In addition it has been an object of those concerned with this art, including the undersigned, to facilitate assembly and securement of transistors with their associated mounting and encapsulating elements.

Toward these and related objects the invention provides a transistor mounting and heat sink element presented by a relatively massive and approximately horseshoe shaped block of mechanically firm, thermally conductive, electrically insulative or insulated material, which block is substantially coextensive with the underside of a transistor wafer excepting a certain minor portion of said underside. A top surface of the block supports, and is bonded to, a transistor wafer which has minute electrodes and thin whiskers for all electronic connections thereof. Transistors of this type are known by themselves but a new combination is presented by the arrangement wherein such a transistor is bonded to a mounting and heat sink element as described. According to an added feature of the invention the aperture or slot of the horseshoe shaped block extends from the electrode area of the transistor to a side surface of the block, providing insertion and clearance space for a whisker wire leading from an electrode through the slot to an adjacent stem lead which is provided opposite the end of this slot.

It has been found that by means of these arrangements transistor units can be made more effective and more economical than has been possible with prior techniques. Attempts have heretofore been made for instance in so called power transistors to use metallic studs or the like as combined heat sink connectors and electrode leads; however, the unavoidable incorporation of relatively large electrical capacity in stud members of this kind, as also in base tabs of the prior art, has seriously reduced the frequencies attainable by the prior power transistors, in comparison with the frequencies attainable by means of the new, thin-whiskered, specially horseshoe-mounted unit. Prior attempts have also been made to use electrically insulative, thermally conductive elements in contact with electrode or base areas of thin-whiskered high-frequency transistors, to provide a heat sink connection and thus to raise the power level at which the transistors could operate; however, fabrication and/or operation became difficult upon the use of such expedients, in comparison with the performance and production of the new unit.

It is important for successful operation of the new transistor and support unit that the transistor whiskers are very thin and that the massive mounting and heat dissipating element is made in very specific ways, as will be described presently. According to another aspect of the invention it is important for successful use of the new mounting device, in the fabrication of the unit that the horseshoe block is combined with stem leads disposed about this block in a certain, desirably triangular pattern; particularly simple manipulative steps can then be applied to the transistor in the establishment of an unusually effective transistor assembly.

Figures 2, 3, 4:
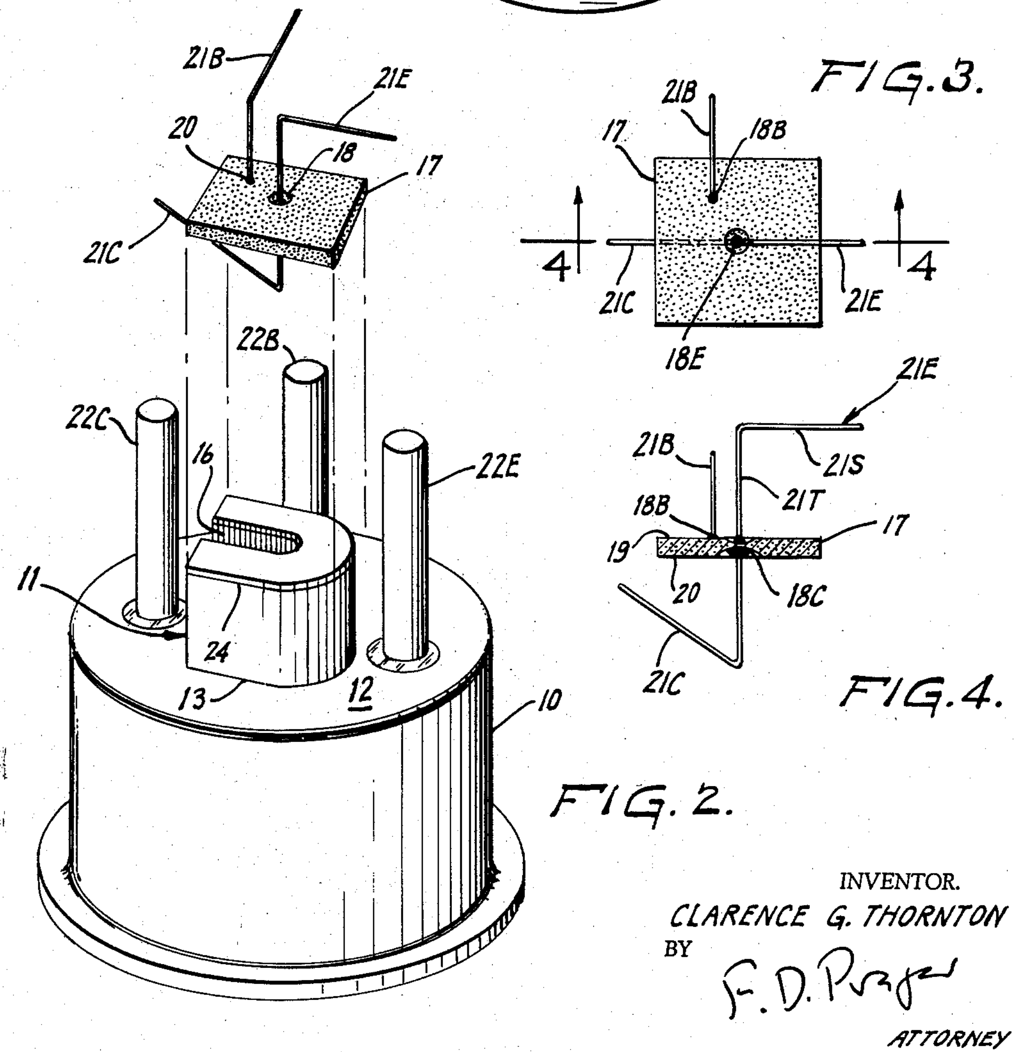
Figure 5:
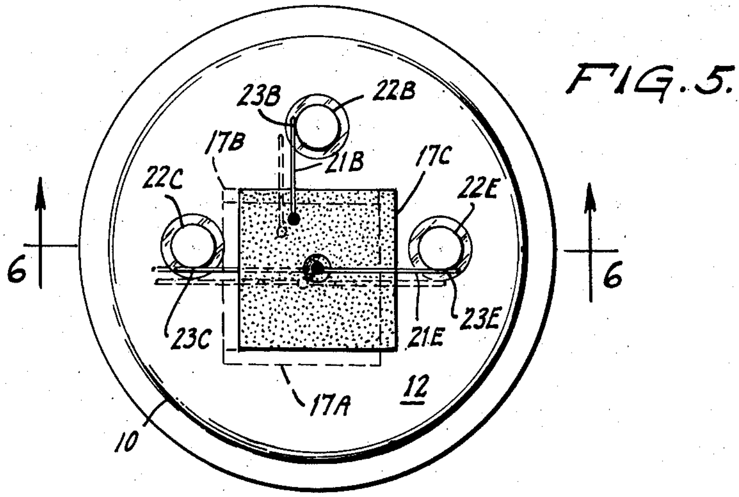
Figure 6:
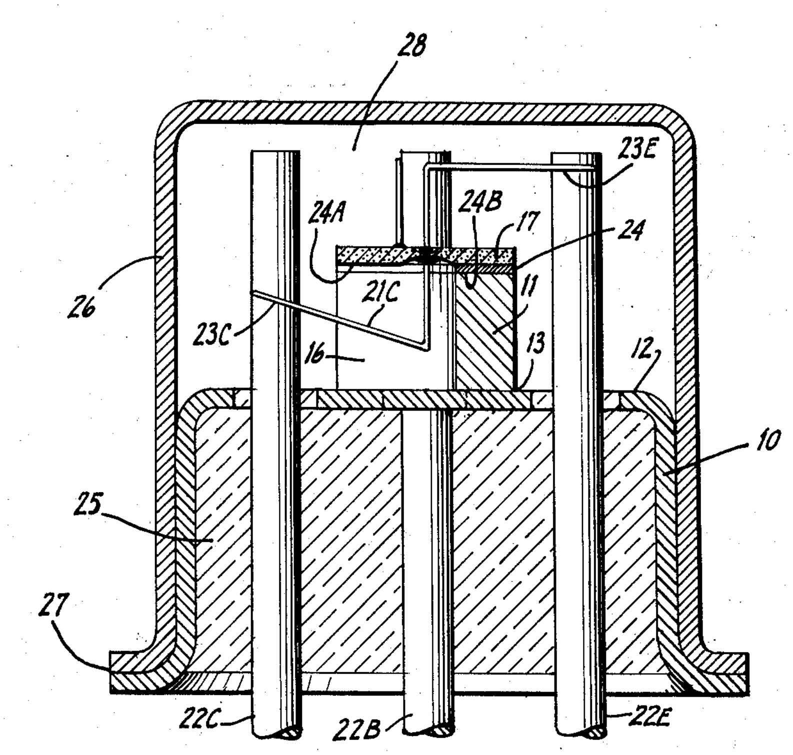

These and other features of the invention will be understood most readily upon a study of the drawing appended hereto wherein FIGURE 1 is a plan view of the new mounting unit and FIGURE 2 is a perspective view showing said unit and also showing, thereabove, the transistor about to be mounted on said unit. FIGURES 3 and 4 are respectively a plan view and a cross-sectional view of said transistor, the cross-section being taken generally along line 4—4 in FIGURE 3. FIGURES 5 and 6 are respectively a plan view and a larger cross-sectional view of the completed transistor and encapsulation unit, the cross-section being taken generally along line 6—6 in FIGURE 5.

As shown in FIGURES 1 and 2, a stem unit 10 is provided which has a transistor connector block 11 secured to the top 12 of said unit, for instance by a solder joint 13. In accordance with the invention the connector block has the general shape of a massive horseshoe or U. The ends 14, 15 of this horseshoe face laterally, whereby the horseshoe slot 16 forms a channel which extends laterally, this channel being open to the top throughout its length and being open also at one end thereof. The horseshoe block is desirably made of copper and is nickel-plated, whereby it combines excellent heat conductivity with safety against impairment of the transistor and with relative simplicity and economy of fabrication.

Transistor 17, as shown in FIGURES 2 to 4, is a flat square wafer having minute emitter and collector electrodes 18E, 18C disposed respectively in the centers of upper and lower surface portions 19, 20 thereof. A small ohmic base connection 18B is eccentrically provided on top surface 19. Each of the electrode or connection members 18E etc. has a very thin and short whisker wire attached thereto and these wires are respectively identified as emitter, collector, and base whiskers 21E, 21C, 21B. By means of features including the smallness of the electrode and the thinness of the three whiskers, the transistor is suitable for high frequency performance.

As may be noted from FIGURE 2 the horizontal dimensions of horseshoe 11 are generally similar to those of the transistor. However, the thickness or height of the horseshoe is much greater than is that of the thin transistor wafer, the appreciable thickness or block-like appearance of horseshoe 11 being provided because the aperture 16 of this horseshoe serves, in accordance with the invention, to receive the downwardly and then outwardly extending collector whisker 21C, with some little clearance around this whisker. The clearance arrangement is such that whisker 21C extends downwardly into the closed end of channel 16 and then outwardly through this channel for connection to other circuitry, the whisker being kept out of contact with the surfaces of horseshoe 11 and with the top 12 of stem unit 10.

In order to provide for connection of this collector whisker to external circuitry, stem unit 10 has a collector stem lead 22C upwardly extending through top 12 approximately opposite the opening 16 of horseshoe 11, as best shown in FIGURE 1. Whisker wire 21C, emerging from this opening 16, can be connected with this lead, see FIGURES 5 and 6. For connection of the other whiskers 21E, 21B, somewhat similar provision is made for an emitter stem lead 22E and a base stem lead 22B. In the ultimate assembly of the device these stem leads are connected to the corresponding whiskers by spot welds 23E, 23C and 23D. These stem leads are more massive and mechanically much more rigid than are the thin whisker wires, the outer ends of the leads (not shown) being used for connecting the transistor to other circuitry. So far as possible, of course, the electric capacity of these leads, as well as that of the whiskers, is minimized.

As best shown in FIGURE 6, a coating 24 of plastic synthetic resin such as epoxy resin is provided between the underside 24A of transistor 17 and the top 24B of the metallic horseshoe block 11. This coating serves not only to provide electric insulation between the semiconductor and the metal of the horseshoe heat sink member, along with a reasonably close or extremely close thermal bond between these materials; the resin coating, when suitably cured and hardened, also serves as a means which firmly but safely holds the transistor wafer to the stem unit. Heretofore a great many proposals have been made for securement of base tabs, support blocks and the like to wafers of germanium, silicon, etc. Experience with such former proposals and with the new unit has indicated that much improvement in power rating and high frequency characteristics is obtained by means of the system of this invention, including the described combination of the semiconductive wafer 17, resin-like coating 24, and slotted metal block 11.

Referring once more to FIGURES 1 and 2 it will be noted that stem leads 22C, 22E and 22B are disposed respectively adjacent the horseshoe opening 16, the opposite end 16A of the horseshoe block and one side 16B of said block, with such clearance from the block that transistor wafer 17 with the whiskers thereon can readily be inserted into the so outlined mounting area generally overlying horseshoe 11 and that some horizontal shifting of the transistor wafer remains possible in this area, for the purpose of establishing the desired contacts between the electrode whiskers and the corresponding stem leads. As best shown in FIGURE 5 the transistor can first be moved from an initial position 17A, overlying principally the side or leg 16C remote from base stem lead 22B, into the position 17B in which the emitter and collector whiskers 21E, 21C contact the corresponding stem leads 22E, 22C. Thereafter the transistor can be shifted laterally into that final position 17C wherein contact is also made between base whisker 21B and the corresponding stem lead 22B, while the aforementioned contacts are maintained at 22E, 22C.

The whiskers are bent or hook-shaped to allow establishment of such contacts and the opening or slot 16 of horseshoe 11 is just wide enough to allow the first mentioned motion from position 17A into position 17B and then to provide substantially centered positions 17B, 17C of collector whisker 21C in this slot. Each hook-spaced whisker, as best shown in FIGURES 3 and 4, comprises a short terminal end 21T which extends at right angles to wafer 17 and a short stem end 21S which extends at a right angle or at least at a non-obtuse angle from end 21T, said angle being desirably an acute one in the case of collector whisker 21C. Advantageously two of the hook-like whiskers—as shown, whiskers 21E, 21C—lie in a single plane normal to that of the wafer; the third hook-like whisker—as shown, whisker 21B—then lies in a plane normal to that which has been mentioned. It will be seen that by these arrangements it becomes particularly simple to perform the above-described manipulation of the unit from position 17A to position 17C. It is unnecessary to apply any special threading-in or other manipulation to the thin whiskers, incident to this insertion of the transistor unit into the mounting assembly.

The above-mentioned feature of firm attachment and securement of transistor wafer 17, with the aid of bond means 24, is especially significant in cases where the transistor unit may be exposed to serious shocks, like those which are encountered incident to travel or incident to launching into space or recovery from space. The stem sleeve, being fitted with glass 25, is substantially vibration-proof and so is the transistor wafer, secured to this filled sleeve by the massive block 11.

The stem leads are anchored in glass filling 25 of stem 10, as best shown in FIGURE 6. This filling can be formed inside the stem unit 10 and in contact with the top 12 thereof by procedures which need not be described herein. The transistor unit is completed by superimposing a cover 26 over the assembled transistor and mounting unit, said cover having flange 27 joined or welded to a matching portion of the stem unit in such a way as to form a hermetically sealed transistor chamber 28 between the cover 26 and stem 10.

For the operation of the transistor unit, the housing consisting of stem 10 and cover 26 is suitably installed and electric connections (not shown) are attached to the outer ends of stem leads 22E, etc., whereby the transistor can function as a switching, oscillating, or signal handling device or the like. Current of high frequency and very appreciable magnitude can then be passed through the transistor during such functioning, thereby generating heat particularly in its collector electrode region. Such heat is readily removed from the transistor surface, including the immediate vicinity of said region, by heat sink or horseshoe 11. Suitable provision is of course made for ultimate dissipation of this heat, which is outwardly conducted from heat sink 11 by the metal of stem unit 10, flange 27, and cover 26; for instance further heat sink means or heat radiating surfaces (not shown) can for this purpose be provided on stem and cover unit 10, 26.

Due to changes of ambient temperature, stem sleeve 10 and metal horseshoe 11 are sometimes subject to thermal expansion and contraction, whereas wafer 17 may temporarily have different temperatures and different thermal expansion or contraction. The resultant stresses can be absorbed in block 11. It is therefore preferred to make a metal block 11 from a ductile metal such as copper.

It is also possible to modify the construction by making the horsehoe block of a material, such as beryllia, which is not only a good thermal conductor but which also approximates the behavior of typical semiconductors as to thermal expansion and contraction. Such beryllia has the further advantage of being an excellent electric insulator, so that no resin coating is required in combination therewith, it being possible simply to solder the semiconductor to a metallized surface of the beryllia. The material is however relatively expensive to provide and to handle, for reasons including its great toxicity.

In the foregoing description and in the claims which follow, certain elements or surfaces are designated as being at the "top" or "bottom" or "underside" of a unit or as being specifically oriented in similar ways. The nomenclature is in keeping with the illustrated arrangement, that is, with cover 26 being disposed above the stem sleeve 10. It will however be understood that the transistor unit can function in any position and that accordingly, in keeping with a general usage for the description of such units, a term such as "top" is not to be interpreted in a strict sense; the term includes a portion or surface which will normally be at the top during the assembly procedure as described.

Also, while only a single embodiment of the invention has been described, it should be understood that the details thereof are not be construed as limitative of the invention, except insofar as is consistent with the scope of the following claims.

I claim:

1. In a transistor unit, a glass-filled stem; a U-shaped, nickel-plated copper heat sink block on said stem, with the aperture of the U extending to a lateral end surface of said block; stem leads extending through the glass of said stem and along parallel upright surfaces of said block at a slight distance from said surfaces; a layer of resinous material on a top surface of said block; and a transistor wafer on said layer, with whiskers including a whisker extending through said aperture to one of said leads and other whiskers upwardly extending to the other leads.

2. A semiconductor unit comprising a stem of electrically insulative material; a U-shaped, thermally conductive block having one surface secured to a surface of said stem with the slot of the U extending along said stem surface, at least an opposed surface of said block being electrically non-conductive; a semiconductive wafer having one side approximately coextensive with and firmly secured to said opposed surface of said block, extending across the slot of the U and spaced by said block from said stem surface; stem leads extending through said stem and stem surface and hermetically sealed to said material and further extending from said stem surface at a slight distance from said block; and whiskers, spaced from said block and including at least one whisker extending from said one side of said wafer into and through said slot of the U and therefrom to one of said stem leads, at least one whisker extending from the other side of said wafer and to another of said stem leads.

3. A unit as described in claim 2 and wherein said block consists of ductile metal, with a layer of electrically insulative material bonding said wafer to said block.

References Cited in the file of this patent

UNITED STATES PATENTS

| | | |
|---|---|---|
| 2,848,665 | Little | Aug. 19, 1958 |
| 2,948,835 | Runyan | Aug. 9, 1960 |
| 3,025,437 | Van Namen | Mar. 13, 1962 |